Figure 1:
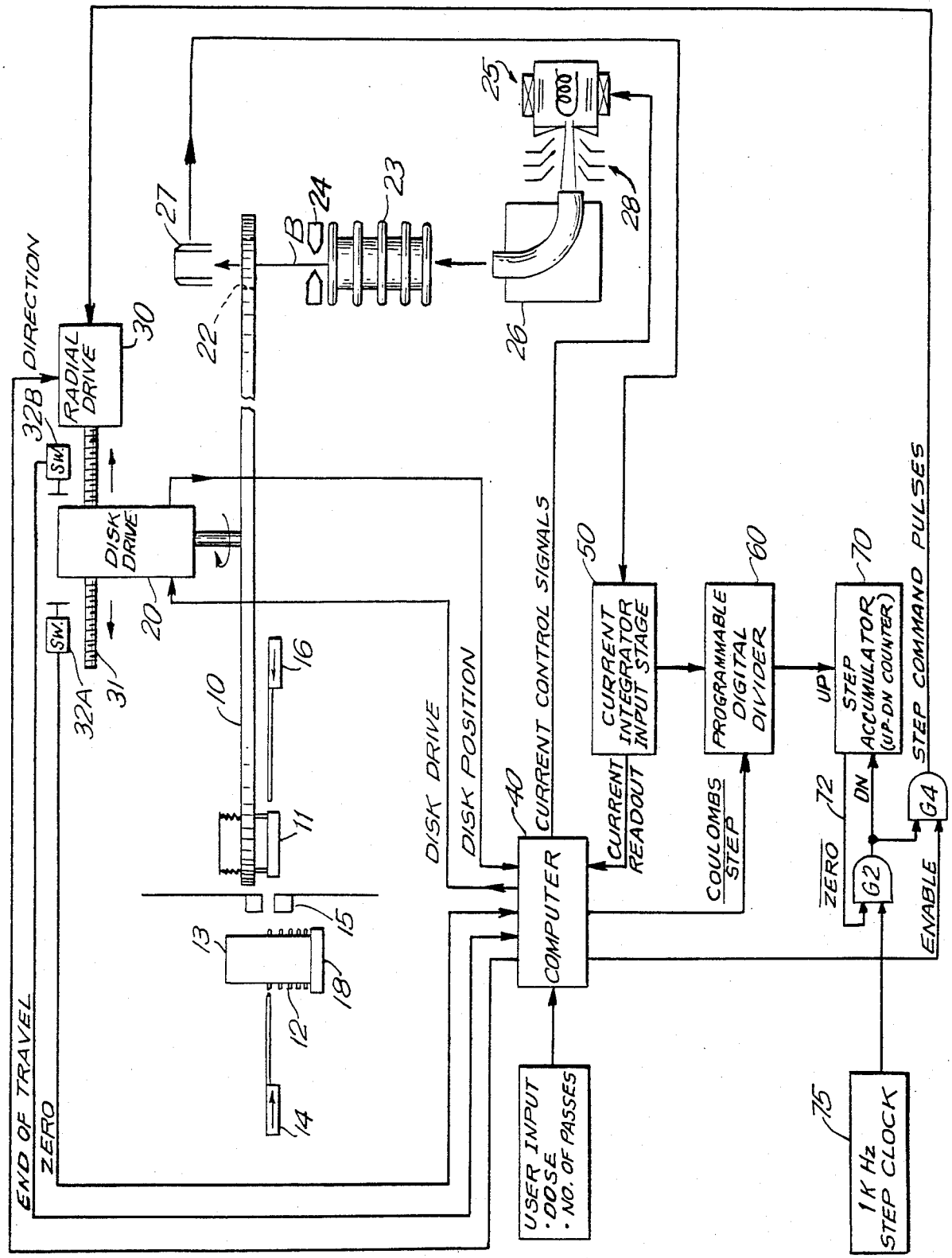

United States Patent [19]

Gault et al.

[11] Patent Number: 4,517,465
[45] Date of Patent: May 14, 1985

[54] ION IMPLANTATION CONTROL SYSTEM

[75] Inventors: Roger B. Gault; Larry L. Keutzer, both of Austin, Tex.

[73] Assignee: VEECO/ai, Inc., Austin, Tex.

[21] Appl. No.: 480,095

[22] Filed: Mar. 29, 1983

[51] Int. Cl.³ .................. A61K 27/02; H01J 37/00
[52] U.S. Cl. ................................................ 250/492.2
[58] Field of Search ............... 250/492.2, 398, 397, 250/442.1; 219/121 EB, 121 EM

[56] References Cited

U.S. PATENT DOCUMENTS

| | | | |
|---|---|---|---|
| 3,689,766 | 9/1972 | Freeman | 250/492.2 |
| 3,778,626 | 12/1973 | Robertson | 250/492.2 |
| 4,011,449 | 3/1977 | Ko et al. | 250/492.2 |
| 4,021,675 | 5/1977 | Shifrin | 250/492.2 |
| 4,234,797 | 11/1980 | Ryding | 250/492.2 |
| 4,383,178 | 5/1983 | Shibata et al. | 250/442.1 |

*Primary Examiner*—Bruce C. Anderson
*Attorney, Agent, or Firm*—Morgan, Finnegan, Pine, Foley & Lee

[57] ABSTRACT

A control system is disclosed for an ion implantation system of the type in which the wafers to be implanted are mounted around the periphery of a disk which rotates and also moves in a radial direction relative to an ion beam to expose successive sections of each wafer to the radiation. The control system senses beam current which passes through one or more apertures in the disk and is collected by a Faraday cup. This current is integrated to obtain a measure of charge which is compared with a calculated value based upon the desired ion dosage and other parameters. The resultant controls the number of incremental steps the rotating disk moves radially to expose the adjacent sections of each wafer. This process is continued usually with two or more traverses until the entire surface of each wafer has been implanted with the proper ion dosage.

9 Claims, 2 Drawing Figures

4,517,465

ION IMPLANTATION CONTROL SYSTEM

BACKGROUND OF THE INVENTION

1. Field of the Invention

The invention involves improvements in ion implantation techniques. It is directed to systems for controlling the ion dosage of work pieces such as semiconductor wafers. These systems utilize a rotary disk which carries the wafers to be irradiated around its periphery and rotates them past an ion beam. As the wafers are irradiated, a second mechanical displacement of the disk occurs in a radial direction so that the entire surface of each wafer is subjected to the beam and receives the proper dosage.

2. Description of the Prior Art

A known technique for implanting ions in wafers utilizes a rotating disk mounted in a vacuum chamber and adapted to carry a set of wafers around the periphery of the disk such that by rotating the disk a portion of each wafer is successively exposed to an ion beam which is projected into the chamber. A second drive system moves the rotating disk assembly in a radial direction so that successive adjacent tracks of each wafer are subjected to the ion beam until the entire surface of each wafer has been implanted.

Patents illustrating this technique include U.S. Pat. No. 4,234,797 issued to Jeffrey Ryding and U.S. Pat. No. 3,778,626 issued to Gordon Ian Robertson.

In one mode of the control system of the Robertson patent, the ion beam is monitored by measuring the current which flows to the disk itself by reason of its interception of the beam. This current is measured through a slip ring system and is supplied to a control system which also senses the radial displacement of the disk relative to the beam. Also supplied as an input to the control system is a desired dosage signal. With these inputs the Robertson control system controls the radial motion of the disk to control the ion distribution over the wafer surface.

The Ryding patent employs a current measurement arrangement which uses, instead of slip rings, a Faraday cage mounted behind the disk and located to receive pulses of the beam current when an aperture in the disk passes in front of the cage exposing it to the ion beam. Ryding employs the measured beam current to control the radial velocity of the rotating disk for the purposes of achieving a uniform ion dosage. While Ryding's technique eliminates the need to sense radial displacement, his process depends upon maintaining angular velocity at a constant value thus introducing a possible source of error.

SUMMARY OF THE INVENTION

The applicants have discovered that controlled uniform ion dosages can be achieved without the need for measuring or sensing radial displacement and without the need to depend upon a constant angular scan velocity. Rather than controlling radial velocity, the control system disclosed herein produces a a number of fixed incremental displacements in a radial direction in dependence on the integration of sensed beam current relative to a desired dosage level. This technique thus does not depend on a constant angular velocity nor does it require sensing of radial displacement.

PREFERRED EMBODIMENT

Figure 2:
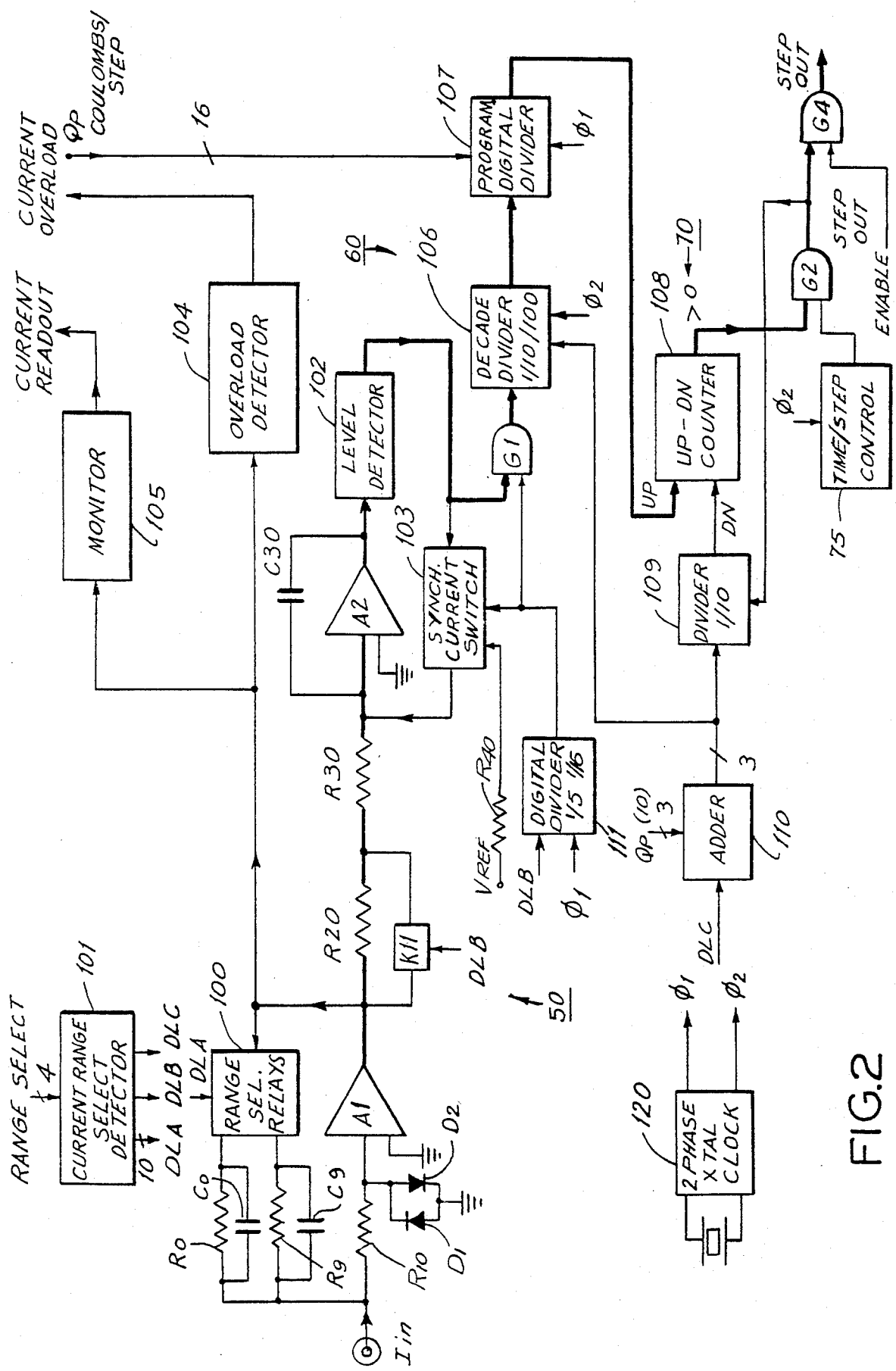

Serving to illustrate a preferred embodiment of the invention are the drawings of which:

FIG. 1 is a schematic diagram of the system illustrating its general geometry as well as the components of the control system and FIG. 2 is a schematic diagram of the radial motor control circuits.

As shown in FIG. 1, a rotatable disk 10 mounted inside a vacuum chamber, not shown, includes a series of wafer clamp assemblies 11 for receiving wafers 12 from a wafer carrier 13.

During the loading cycle of the system, the disk 20 is rotated through a series of successive positions to align successive wafer clamps with the wafer carrier 13. As each position is reached, a loading transfer actuator 14 transfers a wafer 12 from carrier 13 through a wafer valve port 15 to the aligned wafer clamp 11 the underside of which is open to expose the major part of the wafer mounted in it. As each position is loaded, an elevator assembly 18 associated with the wafer carrier elevates the next wafer into alignment with the loader 14. The process continues until all the wafer sites are loaded.

After implantation, a generally similar unloading process occurs. The disk 10 is positioned to successively align each wafer site with the wafer valve and with the wafer carrier now arranged and progressively elevated to receive the implanted wafers through the action of unloading transfer assembly 16.

For achieving the foregoing loading and unloading movements of the disk, a position servo arrangement is employed with a resolver located in disk drive 20 serving as the disk position feedback sensor whose output is used to null out the digital command signal, supplied by computer 40, when the disk is in its commanded position. In the illustrative embodiment there are provisions for 15, 20, 25 or 35 wafer positions.

For implanting the wafers, an ion source 25 is utilized. The generated ions are accelerated out of the source with the aid of extraction electrodes 28 and directed to an analysis magnet 26 which subjects the beam to a 90 degree turn. It thereafter passes through an accelerator tube 23 to the analysis slit 24. The resultant beam B radiates the wafers on disk 10 as the latter rotates (at 500 RPM in the preferred embodiment). The beam is generally rectangular in cross section, its long dimension being wider than slot width and being oriented tangentially to the disk and wafers. Its short dimension is a fraction (e.g. $\frac{1}{4}$) of its length and of slot length (e.g. 1/20). An illustrative slot configuration is 9 mm×125 mm, with the long dimension oriented radially and being larger than the wafer diameter.

For sensing beam current, disk 10 is equipped with one or a number of slots 22 which exposes a current collector 27 to beam B during each revolution of disk 10. The measured current is used to control radial movement of the disk 10 and its wafers relative to beam B. The collector is sized to respond to the ion beam radiation over the entire slot length.

This radial motion is accomplished with a radial drive assembly 30 having an output worm shaft 31. Disk drive 20 is coupled to the worm and is displaced in a stepwise fashion by the radial drive which is controlled to function as a stepper motor. The assembly also includes limit detecting switches 32A and 32B which signal the computer when the extremes of a traverse are reached.

The step movement of the radial drive is controlled by the Integrator, Divider and Accumulator stages of FIGS. 1 and 2 while its direction is controlled by computer 40 which counts the passes and keeps track of translation and direction of traversal. (One pass is defined as a traversal from the zero displacement position to full displacement and back again).

In the illustrated embodiment each incremental movement of the radial drive produces a disk displacement of 1/1000th of an inch The mode of operation of the control system is to measure dosage as a function of the number of ions irradiating the slots 22 and to cause this incremental radial movement of the disk as a function of that dosage relative to a predetermined level.

To implement this technique, the system receives as one input the dosage level desired by the user. The latter may also specify the desired number of passes. If defaulted, the computer calculates a minimal integral value for this parameter.

Utilizing these inputs (dosage being in ions/cm²) computer 40 computes the required accumulated charge developed in the slot area for each radial increment. This calculation, expressed in terms of coulombs per step, is given by the equation:

$$\frac{Coulombs}{Step} = \frac{K \cdot Dose \cdot Ai}{2 \cdot N} \quad (1)$$

where K is the charge constant $1.6 \times 10^{-19}$; D is dose in ions/cm²·, Ai is the sensed area, being the product of total slot width and step size, and N=the number of passes.

In addition to the charge/step computation, computer 40 performs the beam current calculation and, as shown in FIG. 1, supplies the appropriate current control signal to ion source 25. This source is preferably of the type in which the desired ions are derived from a plasma discharge process. An appropriate beam current to achieve the desired result is calculated such that the radial motor stepping pulses occur at an average rate of 500 per second when the disk is in the radial drive zero position. Thus:

$$I_{req} = 500 \cdot \frac{Coulombs}{Step}$$

Initiation of the operational phase includes rotation of disk 10 as a consequence of disk drive signals sent to disk drive 20 from computer 40. When rotation has been established, beam current is sampled at each slot once per revolution, e.g., by collector 27, and fed to current integrator input stage 50. The current integrator generates in turn a train of pulses, the number of which is proportional to the integral of the current pulse sensed by collector 27.

This train of pulses is fed to the programmable digital divider 60 which also receives from computer 40 the previously calculated value of required coulombs per step. The divider combines these inputs to derive the appropriate step pulse count, representing the increments the disk should be moved based upon the amount of charge which passed through the slots 22.

This count is stored in a Step Accumulator 70 which is an up-down counter in the illustrated embodiment.

A Step Clock 75 operating for example at a 1 KHz rate, is used to remove (count down) steps from the Accumulator. Any time there are accumulated steps, the Step Clock is gated with line 72 in gate G2 to decrement the count at a 1 KHz rate. If the computer 40 has enabled the drive, these Step Clock pulses are gated through gate G4 to the Radial Drive 30 as Step Command pulses.

Since the computer set up the system to produce an average pulse rate of 500 pulses per second, the Step Accumulator 70 is emptied in approximately ½ the time between successive slot passages. As a consequence, the radial scan motion is discontinuous. It consists of alternating segments of constant radial velocity (e.g., 1 inch/second) and zero radial velocity. In terms of displacement an intermixing of spiral and constant radius segments' is produced.

This stepwise operation typically continues for a full traverse of the disk drive from zero displacement to full displacement and back again to the zero position.

As the distance between the disk axis and the beam decreases the tangential velocity of the active slot section decreases. Since the width of the slots is constant, the time during which the beam passes through them increases, and the integral of the current pulse increases proportionally. This, in turn, increases the number of pulses sent to the Step Accumulator. Since the Step Clock frequency is constant, the time required to empty the Accumulator increases and the section of the scan motion in which the velocity is 1 inch/second increases to compensate for the change in tangential velocity.

When the correct dosage has been applied to the entire surface of the wafers on disk 10, scanning ceases and the wafers are unloaded through valve 15 to the carrier 13 as previously described.

Further details of the Current Integrator, Divider and Accumulator circuits are provided in FIG. 2. As seen therein, the Integrator includes an input amplifier A1 which receives collector cup current, $I_{in}$ via an input resistor R10.

Any one of ten current measuring ranges can be selected in the circuit of FIG. 2 under control of a Range Select input to a Current Range Select Decoder 101. The latter provides three outputs. DLA provides drive to a set of range select relays 100 which selectively switch an appropriate feedback network R0, C0; R1; C1; ... R9, C9 between the output and input of amplifier A1 to provide the proper gain and frequency response for the selected range.

Range is selected by the computer 40 which receives a signal from an Overload Detector 104 driven by the output of amplifier A1. The computer is programmed to vary the range selection in the direction of increasing sensitivity until an overload is detected. When the overload is signalled, the computer backs down two steps by appropriate switching of the Range Select input thereby setting the input amplifier at its maximum sensitivity for safe linear operation.

Also driven by input amplifier A1 is a monitor circuit 105 which supplies a beam current readout signal.

The output of amplifier A1 is fed to the integrating stage A2 via resistors R20 and R30. The former is switched out of the circuit for some range values through a relay K11 operated by the DLB output of decoder 101.

The integrating stage includes an operational amplifier A2 with its feedback integrating capacitor C30. The output of A2 is supplied to a level detector 102 which in addition to supplying an output to gate G1, also drives a synchronous current switch 103 whose output is fed back to the input of amplifier A2. The current switch 103 also receives a reference current input via a resistor R40 energized from the $V_{ref}$ supply. The switch in essence discharges the integrated charge in steps such that the number of steps and their resultant pulses, represent the integral of the input.

The current switch is also controlled as a function of range by a digital divider 111. The divider receives clock input $\emptyset 1$ along with an input DLB from the Range Decoder 101 which represents range coefficients of either three or ten. Divider 111 provides division by either 5 or 16 depending upon the selected range and also supplies the second input to AND gate G1.

The pulses produced at the other input to G1, representing the integral of the sampled current supplied at $I_{in}$, when ANDed are fed to the Programmable Digital Divider 107 via a Decade Divider 106. The latter is controlled by an input received from an adder 110 which receives one input DLC from the range decoder 101 and a second input from one line of the $Q_p$ output (coulombs per step) of the computer 40. The DLC input to adder 110 is set for range values of $10^{-3}$ to $10^{-7}$. The output of Adder 110 determines whether Decade Divider 106 divides by one, by ten or by one hundred.

Decade divider 106 is clocked by the $\emptyset 2$ clock signal and supplies its output to the Programmable Digital Divider 107 which is implemented with a counter and also receives the computed coulombs-per-step value, Qp. It is strobed by the $\emptyset 1$ output of the clock and its output constitutes count UP signals for the Up/Down Counter 108. As previously noted, the output of counter 108 is ANDed with step clock 75 in gate G2. The output of G2 is ANDed in turn in gate G4 with the ENABLE line of computer 40 to provide the step drive to the radial motor.

The output of G2 is also fed back to a divider 109 which receives a range dependent input from adder 110 and supplies the down DN terminal of counter 108 for the purposes previously described.

By way of illustrating the operation of the system consider the case where disk 10 has 5 slots and rotates at 500 RPM. Assume the desired dosage is $2 \times 10^{15}$ ions/cm$^2$, the selected (or computed) number of passes is 13, and the incremental slot area is $1.13 \times 10^{-2}$ cm$^2$. As a result the charge per step is $1.390 \times 10^{-7}$ Coulombs/Step.

Assume a particular beam current condition such that the integrator input is a train of 5 ma pulses. Under these conditions, a representative output from the integrator would contain 300 pulses. The programmable divider would be set to divide this output by 25, producing a count 12 in the accumulator. This in turn would cause 12 step pulses to be sent to the radial drive to displace the disk 0.012 inches.

What is claimed is:

1. In an ion implantation system having an ion beam, a rotating wafer support and displacement means for displacing the rotating support in a radial direction to expose successive sections of wafers carried on said support to said ion beam as the rotating support is displaced radially, the improvement comprising:

(a) means for computing a signal indicative of charge delivered to a section of said support;
    (b) means for generating a signal indicative of desired dosage;
    (c) displacement control means responsive to said charge and dosage signals for producing a signal for causing a sequence of predetermined incremental displacements of said support by said displacement means, and wherein each incremental displacement occurs at substantially the same velocity with the number of said incremental displacements being responsive to the values of said charge and dosage signals.

2. The apparatus of claim 1 in which said section of said support comprises an area defined by a slot in said support and the dimension of said predetermined increment.

3. The apparatus of claim 1 in which said incremental radial displacements are produced repetitively in reciprocal directions until a total desired dosage is obtained.

4. The apparatus of claim 1 in which said support includes a slot irradiated by said beam and in which the dosage signal represents desired dosage, slot width and increment length.

5. An ion implantation system having an ion beam, a rotating wafer support having an aperture, and means for rotating the support to expose successive wafers carried on said support to said ion base, the improvement comprising:

(a) radial displacement means coupled to said wafer support and configured to produce substantially constant velocity stepwise radial displacements of the support to expose successive sections of said wafers to said beam;
    (b) measuring means positioned to be periodically radiated by said beam via said aperture for computing a signal indicative of charge delivered to a section of said support;
    (c) means for generating a signal indicative of desired dosage;
    (d) means responsive to said desired dosage signal for computing a signal representing desired dosage per step;
    (e) displacement control means responsive to said charge and dosage per step signals for computing the required number of step drive pulses for said radial displacement means whereby said support undergoes a computed number of substantially constant velocity increments.

6. The system of claim 5 in which said measuring means produce a pulse train having a number of pulses related to said delivered charge.

7. The system of claim 6 in which said displacement control means include a digital divider for dividing said charge signal by said dosage per step signal.

8. The system of claim 7 including clocked gating means for gating the output of said divider to said radial displacement means.

9. The system of claims 5, 6, 7 or 8 including means for adjusting the intensity of said ion beam.

* * * * *